United States Patent
Ibuki et al.

(10) Patent No.: US 9,093,341 B2
(45) Date of Patent: Jul. 28, 2015

(54) IMAGING APPARATUS, MANUFACTURING METHOD THEREOF AND IMAGING DISPLAY SYSTEM

(71) Applicant: Japan Display West, Inc., Aichi-Ken (JP)

(72) Inventors: Shinya Ibuki, Tottori (JP); Takayuki Kato, Tottori (JP)

(73) Assignee: Japan Display Inc., Tokyo (JP)

( * ) Notice: Subject to any disclaimer, the term of this patent is extended or adjusted under 35 U.S.C. 154(b) by 232 days.

(21) Appl. No.: 13/749,405

(22) Filed: Jan. 24, 2013

(65) Prior Publication Data

US 2013/0206993 A1     Aug. 15, 2013

(30) Foreign Application Priority Data

Feb. 9, 2012    (JP) ................................ 2012-026251

(51) Int. Cl.
    *G01T 1/20*       (2006.01)
    *H01L 27/146*    (2006.01)
    *H01L 31/18*     (2006.01)

(52) U.S. Cl.
    CPC ........ *H01L 27/14601* (2013.01); *G01T 1/2006* (2013.01); *H01L 27/14603* (2013.01); *H01L 27/14609* (2013.01); *H01L 27/14663* (2013.01); *H01L 27/14692* (2013.01); *H01L 31/18* (2013.01)

(58) Field of Classification Search
    CPC ................... H01L 27/14601; H01L 27/14663; G01T 1/241
    USPC ......................... 250/366–368, 370.09, 370.11
    See application file for complete search history.

(56) References Cited

U.S. PATENT DOCUMENTS

2010/0171122 A1*    7/2010   Eguchi ............................ 257/66

FOREIGN PATENT DOCUMENTS

JP        2009-231399      10/2009

* cited by examiner

*Primary Examiner* — David Porta
*Assistant Examiner* — Meenakshi Sahu
(74) *Attorney, Agent, or Firm* — Fishman Stewart Yamaguchi PLLC

(57) ABSTRACT

An imaging apparatus includes: a sensor substrate, wherein the sensor substrate has plural photoelectric conversion devices and driving devices thereof formed on a substrate, signal lines for reading imaging signals obtained in the photoelectric conversion devices through the driving devices and relay electrodes electrically connecting between the driving devices and the signal lines to relay between them.

9 Claims, 15 Drawing Sheets

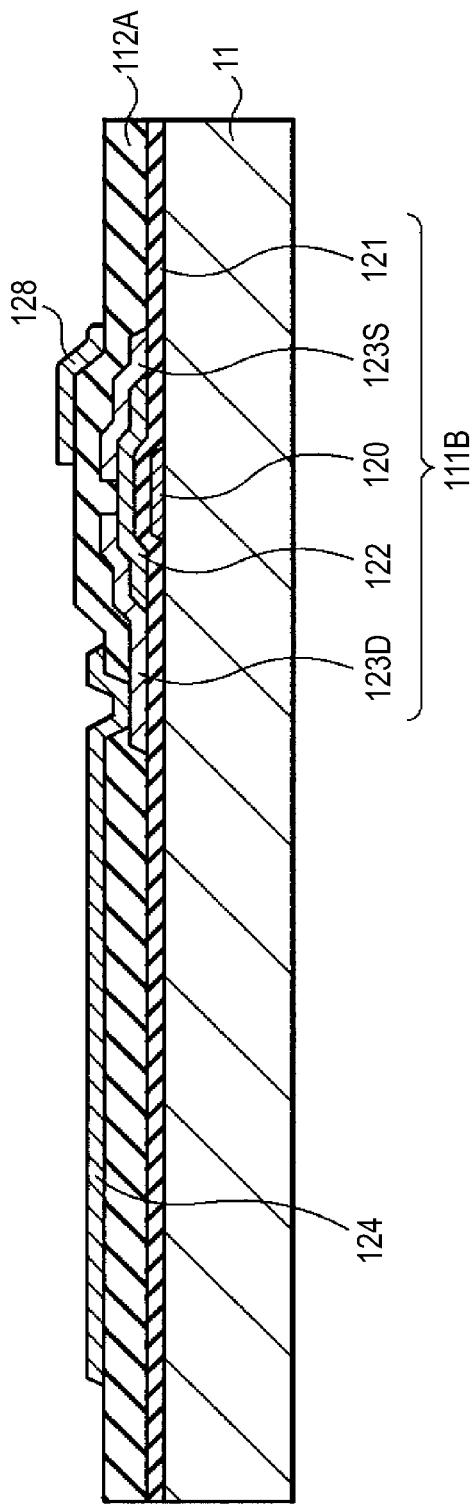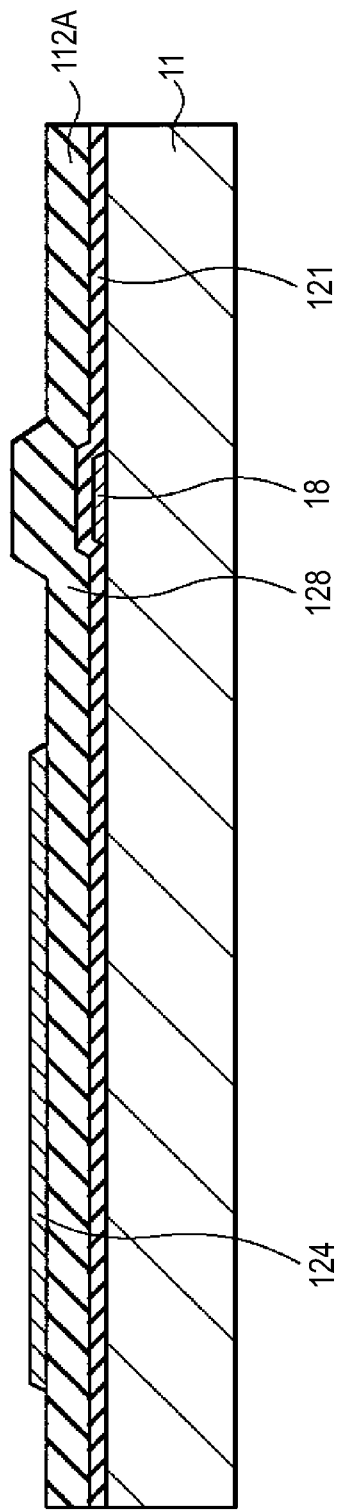

IMAGING APPARATUS, MANUFACTURING METHOD THEREOF AND IMAGING DISPLAY SYSTEM

FIELD

The present disclosure relates to an imaging apparatus having a sensor substrate including photoelectric conversion devices, a manufacturing method thereof and an imaging display system including the imaging apparatus.

BACKGROUND

Various types of imaging apparatuses including photoelectric conversion devices (photodiodes) in respective pixels (imaging pixels) have been heretofore proposed. As an example of such imaging apparatus including the photoelectric conversion devices, a so-called touch panel, a radiation imaging apparatus (for example, refer to JP-A-2009-231399 (Patent Document 1)) and the like can be cited.

SUMMARY

Incidentally, in the above-described imaging apparatuses, an imaged image can be generally obtained by driving plural pixels (imaging drive). Various types of methods for improving image quality of the imaged image obtained in this manner have been also proposed, however, further proposal of methods for improvement is requested.

In view of the above, it is desirable to provide an imaging apparatus capable of improving image quality of the imaged image and a manufacturing method thereof as well as an imaging display system including the imaging apparatus.

An embodiment of the present disclosure is directed to an imaging apparatus including a sensor substrate. The sensor substrate has plural photoelectric conversion devices and driving devices thereof formed on a substrate, signal lines for reading imaging signals obtained in the photoelectric conversion devices through the driving devices and relay electrodes electrically connecting between the driving devices and the signal lines to relay between them.

Another embodiment of the present disclosure is directed to an imaging display system including the imaging apparatus described above, and a display device performing image display based on imaging signals obtained by the imaging apparatus.

Still another embodiment of the present disclosure is directed to a manufacturing method of an imaging apparatus including forming a sensor substrate. A process of forming the sensor substrate has forming plural photoelectric conversion devices and driving devices thereof on a substrate, forming signal lines for reading imaging signals obtained in the photoelectric conversion devices through the driving devices, and forming relay electrodes electrically connecting between the driving devices and the signal lines to relay between them.

In the imaging apparatus, the manufacturing method thereof and the imaging display system according to the embodiments of the present disclosure, the relay electrodes electrically connecting and relaying between the driving devices of the photoelectric conversion devices and the signal lines for reading imaging signals obtained in the photoelectric conversion devices through the driving devices are provided on the sensor substrate. According to the relay electrodes, coupling capacity formed between the photoelectric conversion devices and the signal lines are reduced and noise components in the imaging signals is reduced.

In the imaging apparatus, the manufacturing method thereof and the imaging display system according to the embodiments of the present disclosure, the relay electrodes electrically connecting and relaying between the driving devices of the photoelectric conversion devices and the signal lines for reading imaging signals obtained in the photoelectric conversion devices through the driving devices are provided on the sensor substrate, therefore, noise components in the imaging signals can be reduced. Accordingly, image quality of an imaged image can be improved.

BRIEF DESCRIPTION OF THE DRAWINGS

FIGS. 7A and 7B show cross-sectional views showing a process in a manufacturing method of the radiation imaging apparatus shown in FIG. 1;

DETAILED DESCRIPTION

Hereinafter, an embodiment of the present disclosure will be explained with reference to the drawings. The explanation will be made in the following order.

1. Embodiment (Example of a radiation imaging apparatus including a relay electrode continuously formed)
2. Modification Example (Example of a radiation imaging apparatus including a pair of relay electrodes through a separation portion)

3. Application Example (Application example to a radiation imaging display system)
4. Other Modification Examples (Examples of imaging apparatuses other than the radiation imaging apparatus, etc.)

1. Embodiment

Cross-Sectional Structure of Radiation Imaging Apparatus 1

Figure 1:
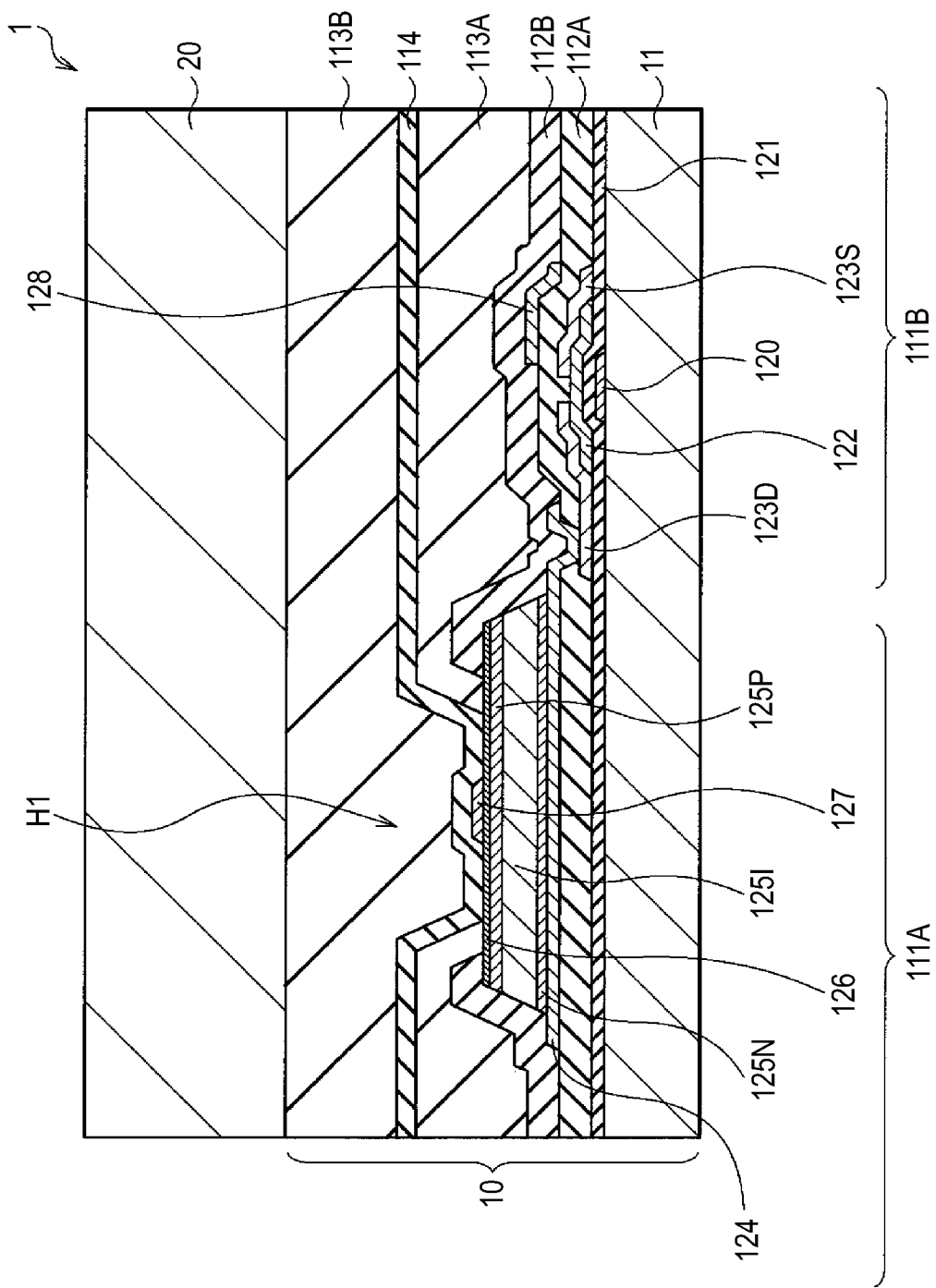
FIG. 1 is a cross-sectional view showing a structure example of a radiation imaging apparatus according to an embodiment of the present disclosure.

FIG. 1 shows a cross-sectional structure example of an imaging apparatus (radiation imaging apparatus) 1 according to an embodiment of the present disclosure. The radiation imaging apparatus 1 receives radiation rays typified by an α-ray, a β-ray, a γ-ray and an X-ray by performing photoelectric conversion and reads image information (images an object) based on radiation rays. The radiation imaging apparatus 1 is suitably used as an X-ray imaging apparatus for medical application or other nondestructive inspection such as baggage inspection.

The radiation imaging apparatus 1 is configured by arranging a later-described wavelength conversion member 20 on a sensor substrate 10. The sensor substrate 10 and the wavelength conversion member 20 are fabricated as different modules.

The sensor substrate 10 has plural pixels (later-described unit pixels P). The sensor substrate 10 is configured by forming a pixel circuit including plural photodiodes (photoelectric conversion devices) 111A and thin-film transistors (TFT) 111B as driving devices of the photodiodes 111A on a surface of a substrate 11. In the embodiment, the photodiodes 111A and the thin-film transistors 111B are arranged side by side on the substrate 11 made of glass and the like, in which part of them (a later-described gate insulating film 121, a first interlayer insulating film 112A and a second interlayer insulating film 112B in this case) are layers common to the photodiodes 111A and the thin-film transistors 111B.

The gate insulating film 121 is provided on the substrate 11, which is formed by a single-layer film formed by one kind of, for example, a silicon oxide ($SiO_2$) film, a silicon oxynitride (SiON) film and a silicon nitride (SiN) film, or a stacked film formed by two or more kinds of the above films.

The first interlayer insulating film 112A is provided on the gate insulating film 121, which is formed by an insulating film such as the silicon oxide film or the silicon nitride film. The first interlayer insulating film 112A also functions as a protection film (passivation film) covering the later-described thin-film transistors 111B.

(Photodiode 111A)

A photodiode 111A is a photoelectric conversion device generating electric charges (light charges) of a charge amount corresponding to a light amount (light receiving amount) of incident light, which is made of, for example, a PIN (Positive Intrinsic Negative Diode) type photodiode. In the photodiode 111A, a sensitivity range is, for example, a visible range (a light-receiving wavelength band is the visible range). The photodiodes 111A are arranged in, for example, a selective area on the substrate 11 through the gate insulating film 121 and the first interlayer insulating film 112A.

Specifically, the photodiode 111A is formed by stacking a lower electrode 124, an n-type semiconductor layer 125N, an i-type semiconductor layer 125I, a p-type semiconductor layer 125P and an upper electrode 126 in this order on the first interlayer insulating film 112A. Among the above, the n-type semiconductor layer 125N, the i-type semiconductor layer 125I and the p-type semiconductor layer 125P correspond to a specific example of a "photoelectric conversion layer" in the present disclosure. Though the example in which the n-type semiconductor layer 125N is provided on the substrate's side (lower side) and the p-type semiconductor layer 125P is provided on an upper side respectively is cited in this case, a structure reverse to the above, namely, the structure in which the p-type semiconductor layer is provided on the lower side (the substrate's side) and the n-type semiconductor layer is provided on the upper side can be also applied.

The lower electrode 124 is an electrode for reading signal charges from the photoelectric conversion layer (the n-type semiconductor layer 125N, the i-type semiconductor layer 125I and the p-type semiconductor layer 125P), which is connected to a later-described drain electrode 123D in the thin-film transistor 111B in this case. The lower electrode 124 is formed by, for example, a three-layer structure in which molybdenum (Mo), aluminum (Al) and molybdenum (Mo/Al/Mo) are stacked.

The n-type semiconductor layer 125N is made of, for example, amorphous silicon (a-Si), forming an n+ region. The thickness of the n-type semiconductor layer 125N is, for example, 10 nm to 50 nm.

The i-type semiconductor layer 125I is a semiconductor layer having lower conductivity than the n-type semiconductor layer 125N and the p-type semiconductor layer 125P, for example, a non-doped intrinsic semiconductor layer, which is made of, for example, the amorphous silicon (a-Si). The thickness of the i-type semiconductor layer 125I is, for example, 400 nm to 1000 nm. As the thickness is increased, light sensitivity can be increased accordingly.

The p-type semiconductor layer 125P is made of, for example, the amorphous silicon (a-Si), forming a p+ region. The thickness of the p-type semiconductor layer 125P is, for example, 40 nm to 50 nm.

The upper electrode 126 is an electrode for supplying a reference potential (bias potential), for example, at the time of photoelectric conversion to the photoelectric conversion layer, which is connected to a wiring layer 127 as a power supply wiring for supplying the reference potential. The upper electrode 126 is formed by, for example, a transparent conductive film such as ITO (Indium Tin Oxide).

(Thin-Film Transistor 111B)

The thin-film transistor 111B is formed by, for example, a field-effect transistor (FET). In the thin-film transistor 111B, a gate electrode 120 made of, for example, titanium (Ti), Al, Mo, tungsten (W), chrome (Cr) and so on is formed on the substrate 11, and the gate insulating film 121 is formed over the gate electrode 120.

A semiconductor layer 122 is formed on the gate insulating film 121, and the semiconductor layer 122 has a channel region. The semiconductor layer 122 is made of, for example, polycrystalline silicon, microcrystalline silicon or amorphous silicon. The semiconductor layer 122 can be also made of an oxide semiconductor such as indium gallium zinc oxide (InGaZnO) or Zinc Oxide (ZnO).

On the semiconductor layer 122, a source electrode 123S and the drain electrode 123D are formed. Specifically, the drain electrode 123D is connected to the lower electrode 124 in the photodiode 111A, and the source electrode 123S is connected to a later-described vertical signal line 18 (not shown in FIG. 1) through a later-described relay electrode 128 shown in FIG. 1 and so on. The source electrode 123C and the drain electrode 123D are respectively made of, for example, Ti, Al, Mo, W, Cr and the like. The above-described relay electrode 128 is formed in the same layer as the lower electrode 124 in the photodiode 111A (on the first interlayer insulating film 112A) as shown in FIG. 1 in this case by using the same material, which will be described later in detail.

Also in the sensor substrate 10, the second interlayer insulating film 112B, a first planarization film 113A, a protection film 114 and a second planarization film 113B are provided in this order over the photodiode 111A and the thin-film transistor 111B described above.

The second interlayer insulating film 112B is provided so as to cover the relay electrode 128 and the thin-film transistor 111B as well as a side surface and an end portion of an upper surface (on the upper electrode 126) in the photodiode 111A. The second interlayer insulating film 112B is formed by an insulating film such as the silicon oxide film or the silicon nitride film.

The first planarization film 113A is arranged on the upper layer side of the photodiode 111A and the thin-film transistor 111B, which is made of, for example, a transparent resin material such as polyamide. The thickness of the first planarization film 113A is, for example, approximately 2.1 μm or less in a portion (planarized portion) other than a forming region of the photodiode 111A. Also in the first planarization film 113A, an opening H1 is formed so as to correspond to the vicinity of the forming region of the photodiode 111A. A side surface of the opening H1 is in a tapered state, and the side surface is arranged above the upper electrode 126.

The protection film 114 is provided on the entire surface of the upper electrode 126, the wiring layer 127 and the first planarization film. 113A, which is formed by an insulating film such as the silicon oxide film or the silicon nitride film.

The second planarization film 113B is provided on the entire surface of the protection film 114, which is made of, for example, a transparent resin material such as polyimide.

(Wavelength Conversion Member 20)

The wavelength conversion member 20 is fabricated as a module different from the sensor substrate 10 as described above, which is formed by, for example, a scintillator plate (scintillator panel) and so on. That is, the wavelength conversion member 20 is a member having a flat-board shape (plate shape), in which a scintillator layer (wavelength conversion layer) is provided on a transparent substrate such as glass. A protection film having a moistureproof property may be formed on the scintillator layer, or the protection film may be provided so as to cover the entire scintillator layer and the substrate.

As the wavelength conversion member 20, for example, a scintillator (phosphor) which converts the radiation ray (X-ray) into visible light is used. In other words, the wavelength conversion member 20 has a function of performing wavelength conversion of the radiation ray (X-ray) incident from the outside into the sensitivity range (visible range) of the photoelectric conversion device 111A. As such phosphors, for example, a material (CsI; Tl) obtained by adding thallium (Tl) to cesium iodide (CsI), a material obtained by adding terbium (Tb) to cadmium sulfur oxide ($Gd_2O_2S$), BaFX (X is Cl, Br, I or the like) can be cited. The thickness of the scintillator layer is preferably 100 μm to 600 μm. For example, when the CsI; Tl is used as the phosphor material, the thickness is, for example, 600 μm. The scintillator layer can be molded on a transparent substrate by using, for example, a vacuum deposition method. Though the above-described scintillator plate is cited as an example of the wavelength conversion member 20 in this case, materials are not particularly limited to the above as long as the wavelength conversion member can perform wavelength conversion of the radiation ray into the sensitivity range of the photodiode 111A.

[Detailed Structure of Sensor Substrate 10]

Figure 2:
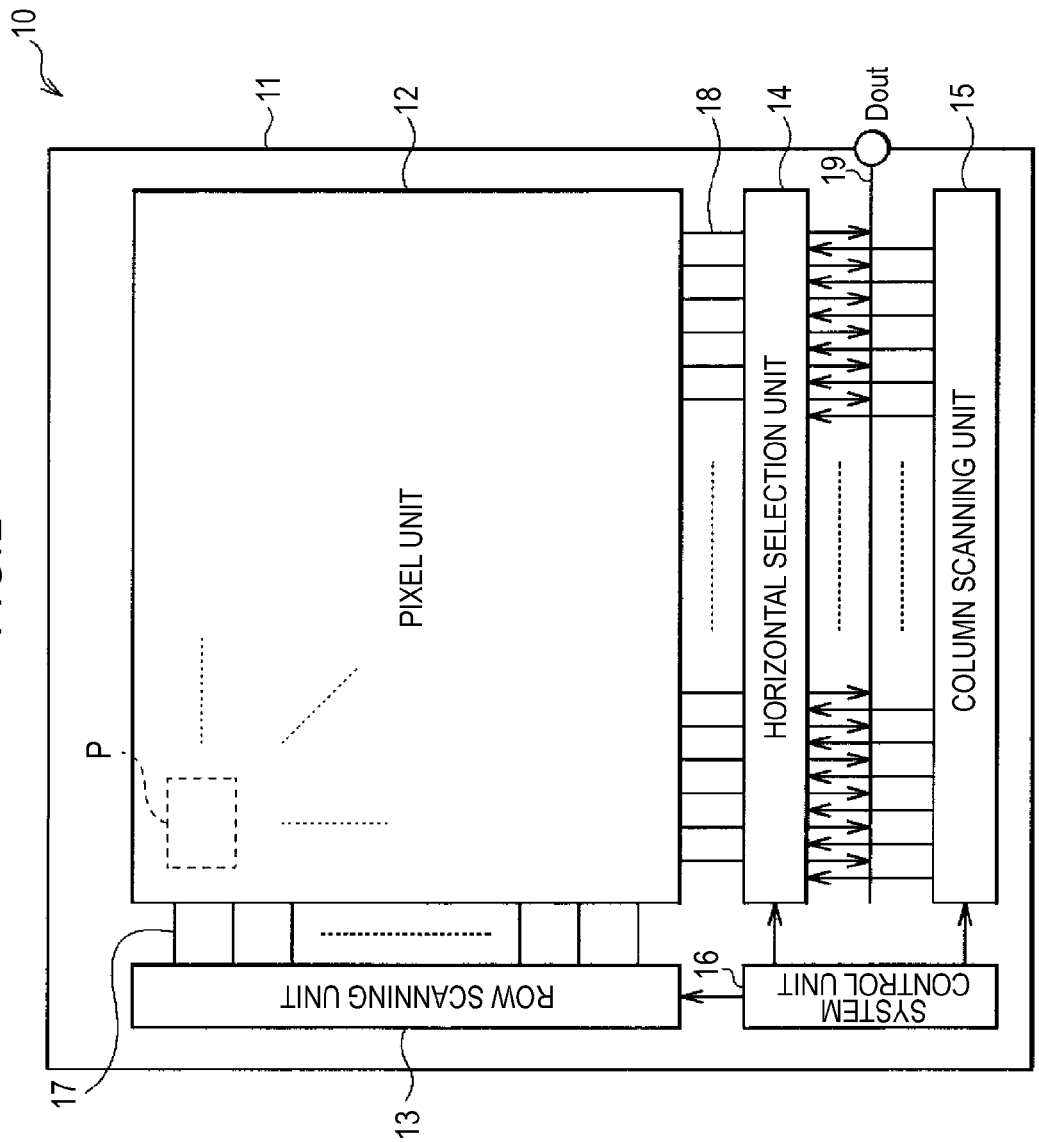
FIG. 2 is a block diagram showing a configuration example of a sensor substrate shown in FIG. 1.

FIG. 2 shows a function block configuration of the above-described sensor substrate 10. The sensor substrate 10 has a pixel unit 12 as an imaging area (imaging unit) and a peripheral circuit (drive circuit) including, for example, a row scanning unit 13, a horizontal selection unit 14, a column scanning unit 15 and a system control unit 16 in a peripheral area of the pixel unit 12 on the substrate 11.

(Pixel Unit 12)

The pixel unit 12 has unit pixels P (hereinafter may be written merely as "pixels"), for example, two-dimensionally arranged in a matrix state, and each unit pixel P includes the above photodiode 111A and the thin-film transistor 111B. In the unit pixels P, pixel drive lines 17 (for example, row selection lines, reset control lines and the like: gate lines) are wired in respective pixel row, and vertical signal lines 18 are wired in respective pixel columns. The pixel drive lines 17 transmits a drive signal for reading imaging signals from the unit pixels P. One ends of the pixel drive lines 17 are connected to output terminals corresponding to respective rows of the row scanning unit 13. On the other hand, the vertical signal lines 18 are provided for reading imaging signals from the photodiodes 111A in the unit pixels P through the thin-film transistors 111B (and the later-described relay electrode 128 and the like). The vertical signal lines 18 correspond to one specific example of "signal lines" in the embodiment of the present disclosure.

Figure 3:
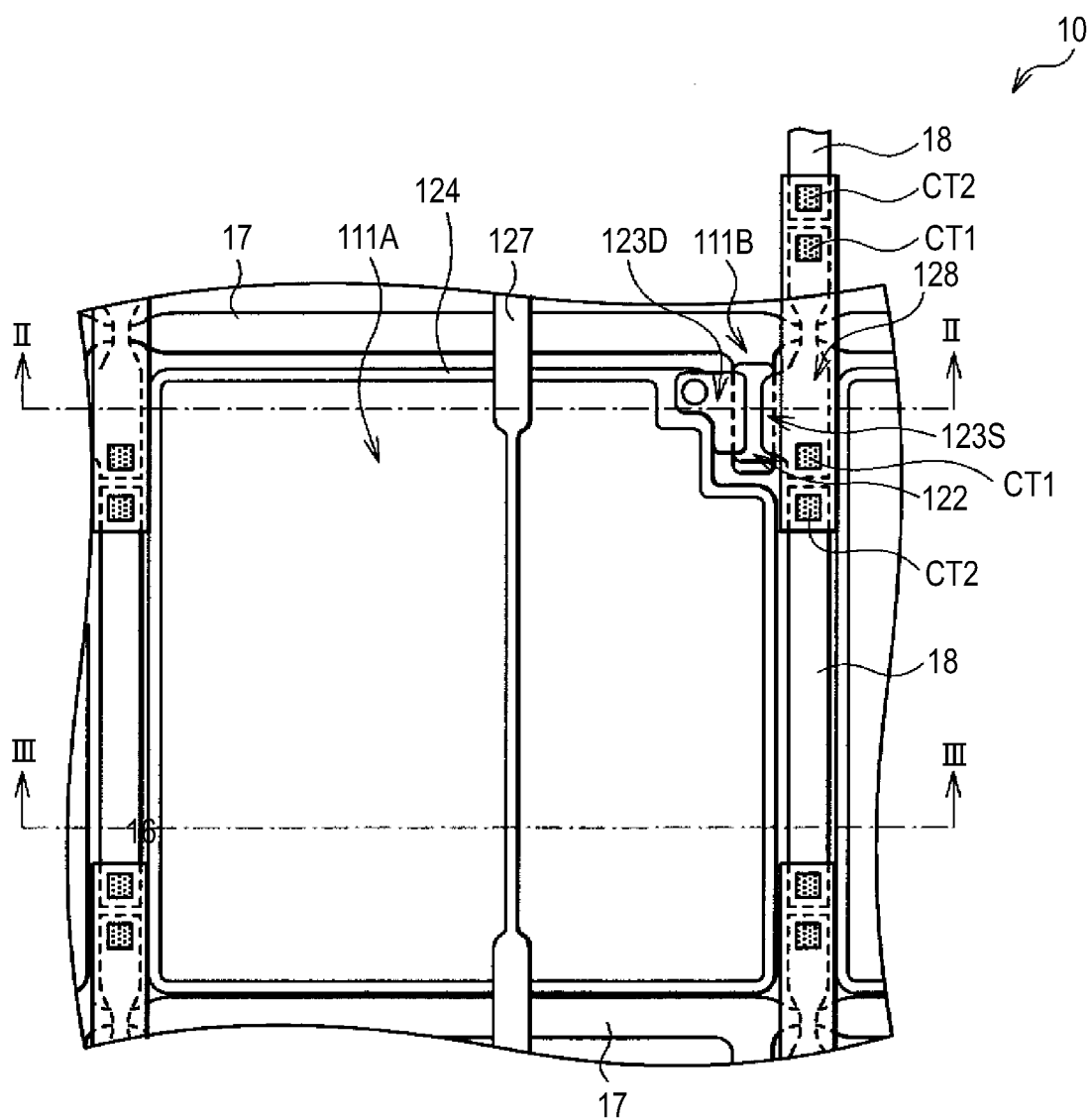
FIG. 3 is a plan view showing a structure example of the sensor substrate shown in FIG. 1.

Here, FIG. 3 shows a planar structure example of the unit pixel P in the sensor substrate 10 (pixel unit 12). As shown in the drawing, the drain electrode 123D in the thin-film transistor 111B (driving device) is connected to the lower electrode 124 in the photodiode 111A in the unit pixel P. The source electrode 123S is electrically connected to the later-described relay electrode 128 through a contact portion CT1, and further, the relay electrode 128 is electrically connected to the vertical signal line 18 through a contact portion CT2. That is, the vertical signal line 18 is electrically connected to the source electrode 123S in the thin-film transistor 111B through the relay electrode 128 and the contact portions CT1, CT2. A cross-sectional structure example taken along the line II-II shown in FIG. 3 corresponds to a cross-sectional structure of the sensor substrate 10 shown in FIG. 1.

Figure 4:
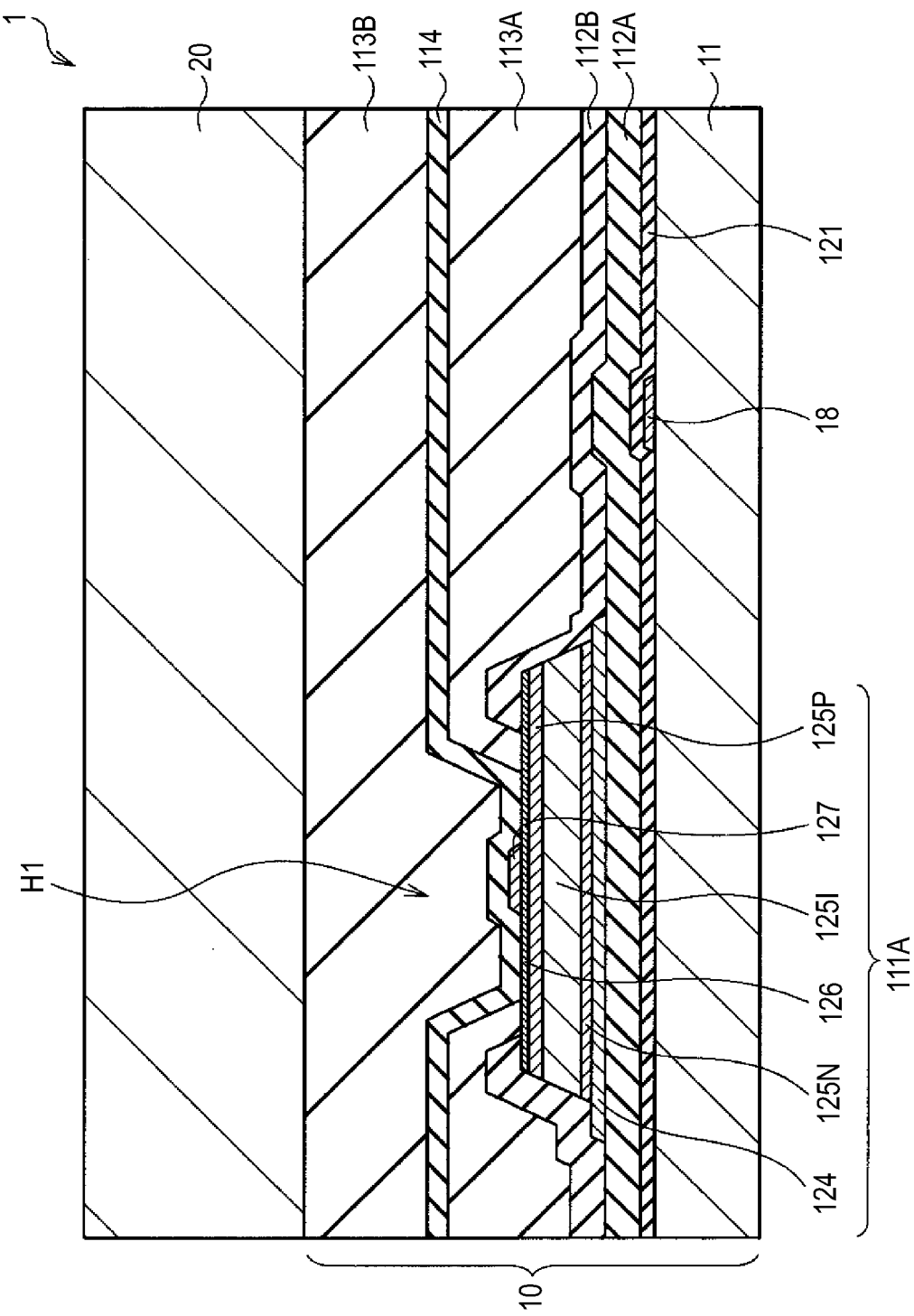
FIG. 4 is a view showing a cross-sectional structure example taken along the line III-III shown in FIG. 3.

On the other hand, FIG. 4 shows a cross-sectional structure example of the sensor substrate 10 taken along the line shown in FIG. 3. The cross-sectional structure shown in FIG. 4 is basically the same as the cross-sectional structure shown in FIG. 1 except that the vertical signal line 18 is formed instead of the thin-film transistor 111B on the substrate 11. Specifically, the vertical signal line 18 is provided at a selective area (corresponds to a forming region of the thin-film transistor 111B in FIG. 1) between the substrate 11 and the gate insulating film 121. That is, the vertical signal line 18 is formed in the same layer and made of the same material as the gate electrode 120 and the pixel drive line 17 (gate line) connected to the gate electrode 120.

Figure 5:
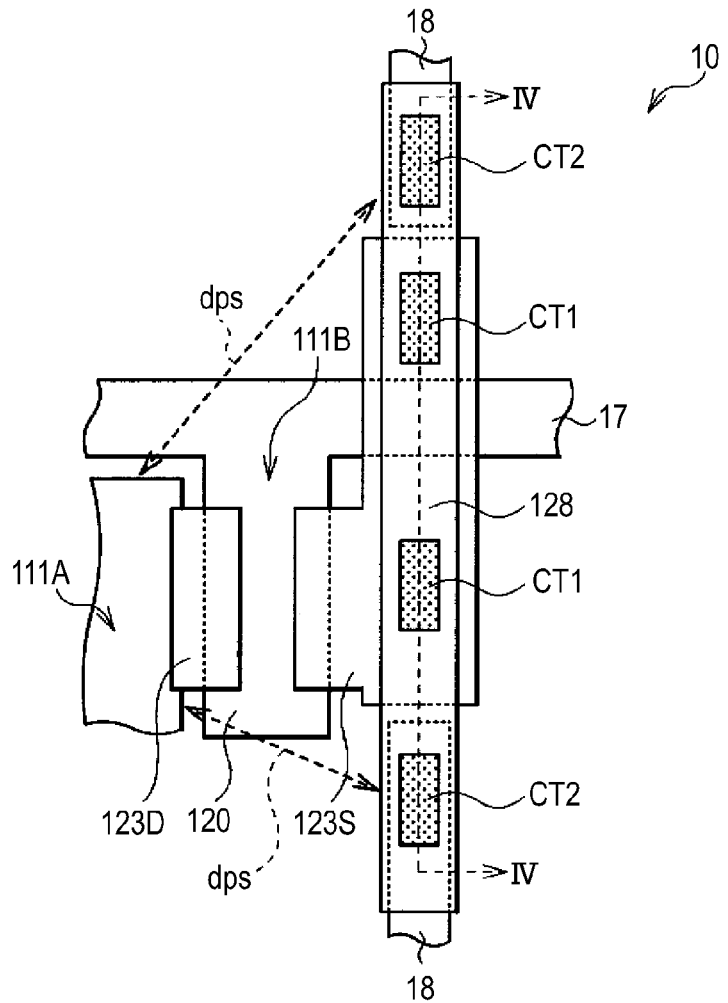
FIG. 5 is a planar schematic view showing part of the sensor substrate shown in FIG. 3 in an enlarged state.
Figure 6:
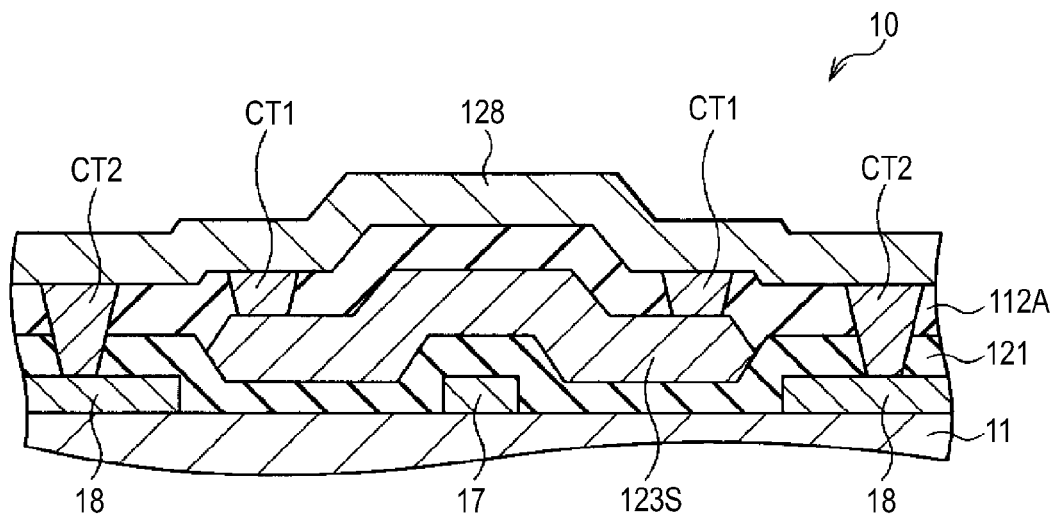
FIG. 6 is a schematic view showing part of a cross-sectional structure taken along the line IV-IV shown in FIG. 5.

FIG. 5 schematically shows part of the planar structure of the sensor substrate 10 shown in FIG. 3 in an enlarged state. FIG. 6 schematically shows part of a cross-sectional structure taken along the line IV-IV in FIG. 5. As shown in FIG. 3 to FIG. 6, the sensor substrate 10 according to the present embodiment is provided with the relay electrode (bridge electrode) 128 electrically connecting between the thin-film transistor 111B and the vertical signal line 18 to relay between them. The relay electrode 128 is locally formed near (in the vicinity of) of the forming region of the thin-film transistor 111B in each thin-film transistor 111B provided so as to correspond to the photodiode 111A in each pixel P. In this case, the relay electrode 128 has a structure of being continuously (integrally) formed in each pixel P. The relay electrode 128 is formed on the upper layer side of each of the vertical signal line 18, the source electrode 123S, the drain electrode 123D and the gate electrode 120 (specifically, in the same layer as the lower electrode 124 of the photodiode 111A) so as to extend along the vertical signal line 18. The relay electrode 128 is formed, for example, in the same process and made of the same material (for example, a three-layer structure in which MO, Al and Mo are stacked (Mo/Al/Mo)) as the lower electrode 124.

(Peripheral Circuit)

The row scanning unit 13 shown in FIG. 2 includes a shift register, an address decoder and so on, which is a pixel drive unit driving respective pixels P in the pixel unit 12, for example, in units of rows. Signals (imaging signals) outputted from respective pixels P of a pixel row selected and scanned by the row scanning unit 13 are supplied to the horizontal selection unit 14 through respective vertical signal lines 18.

The horizontal selection unit 14 includes amplifiers, horizontal selection switches and the like provided in respective vertical signal lines 18.

The column scanning unit 15 includes the shift register, the address decoder and the like, scanning respective horizontal selection switches in the horizontal selection unit 14 and sequentially driving the switches. According to the selective scanning by the column scanning unit 15, signals of respective pixels transmitted through respective vertical signal line 18 are sequentially outputted to a horizontal signal line 19 to be transmitted to the outside of the substrate 11 through the horizontal signal line 19.

The circuit portion including the row scanning unit 13, the horizontal selection unit 14, the column scanning unit 15 and the horizontal signal line 19 may be directly formed on the substrate 11 or may be arranged in an external control IC (Integrated Circuit). The circuit portion may be formed on another substrate connected by a cable and the like.

The system control unit 16 receives a clock given from the outside of the substrate 11, data for instructing an operation mode and so on, and outputs data such as internal information of the radiation imaging apparatus 1. The system control unit 16 further includes a timing generator generating various types of timing signals, performing drive control of the peripheral circuit such as the row scanning unit 13, the horizontal selection unit 14 and the column scanning unit 15 based on the various types of timing signals generated by the timing generator.

[Manufacturing Method of Imaging Apparatus 1]

The above described radiation imaging apparatus 1 can be manufactured by, for example, as follows. FIGS. 7A, 7B to FIG. 12 show an example of a manufacturing method of the radiation imaging apparatus 1 (particularly a manufacturing method of the sensor substrate 10) in a cross-sectional views in the order of processes.

First, the sensor substrate 10 is fabricated. Specifically, first, the thin-film transistor 111B is formed on the substrate 11 made of, for example, glass by a well-known thin-film process as shown in FIG. 7A. Subsequently, the first interlayer insulating film 112A made of the above-described material is formed on the thin-film transistor 111B by using, for example, a CVD (Chemical Vapor Deposition) method and a photolithography method. After that, the lower electrode 124 made of the above-described material is formed so as to electrically connect to the drain electrode 123D in the thin-film transistor 111B by using, for example, a sputtering method and the photolithography method.

Also in this stage, the vertical signal line 18 is formed in the same process and made of the same material as the gate electrode 120 in the thin-film transistor 111B and the pixel signal line (gate line) 17 as shown in FIG. 7B. Furthermore, the relay electrode 128 is formed in the same process and made of the same material as the lower electrode 124 in the photodiode 111A as shown in FIG. 7A. As described above, the vertical signal line 18 is electrically connected to the source electrode 123S in the thin-film transistor 111B through the relay electrode 128 and the contact portions CT1, CT2.

Figure 8:
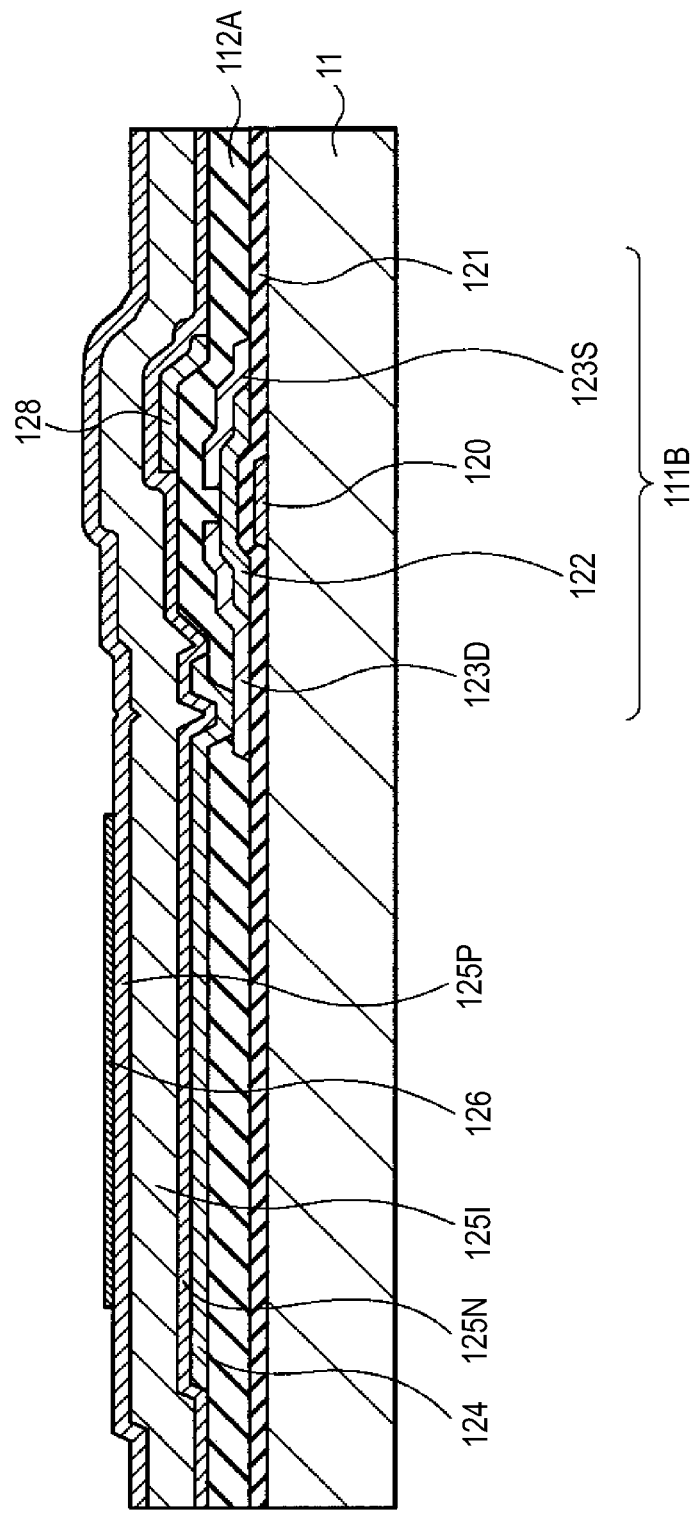
FIG. 8 is a cross-sectional view showing a process continued from FIGS. 7A and 7B.

Next, as shown in FIG. 8, the n-type semiconductor layer 125N, the i-type semiconductor layer 125I and the p-type semiconductor layer 125P made of the above-described material are deposited in this order on the entire surface of the first interlayer insulating film 112A by using, for example, the CVD method. After that, the upper electrode 126 made of the above-described material is formed in a predetermined forming region of the photodiode 111A on the p-type semiconductor layer 125P by using, for example, the sputtering method and the photolithography method.

Figure 9:
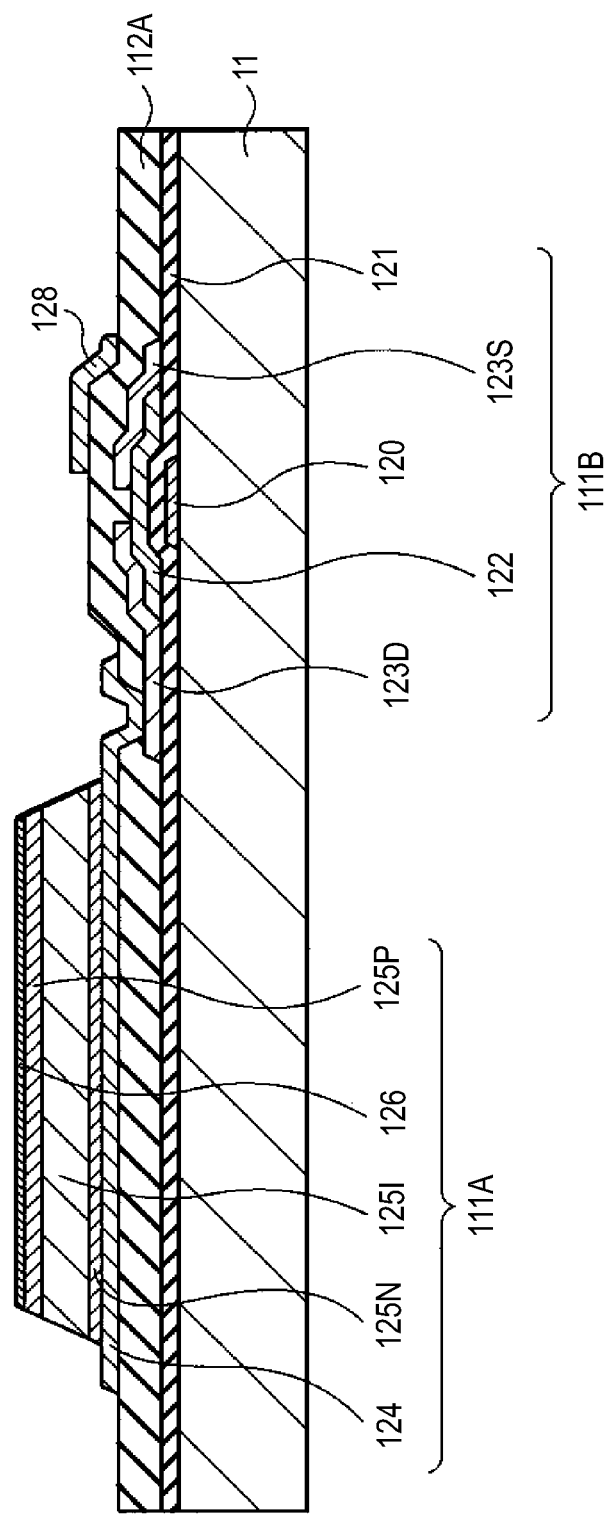
FIG. 9 is a cross-sectional view showing a process continued from FIG. 8.

Subsequently, as shown in FIG. 9, the formed stacked structure of the n-type semiconductor layer 125N, the i-type semiconductor layer 125I and the p-type semiconductor layer 125P is patterned into a given shape by using, for example, a dry etching method. Accordingly, the photodiode 111A is formed on the substrate 11.

Figure 10:
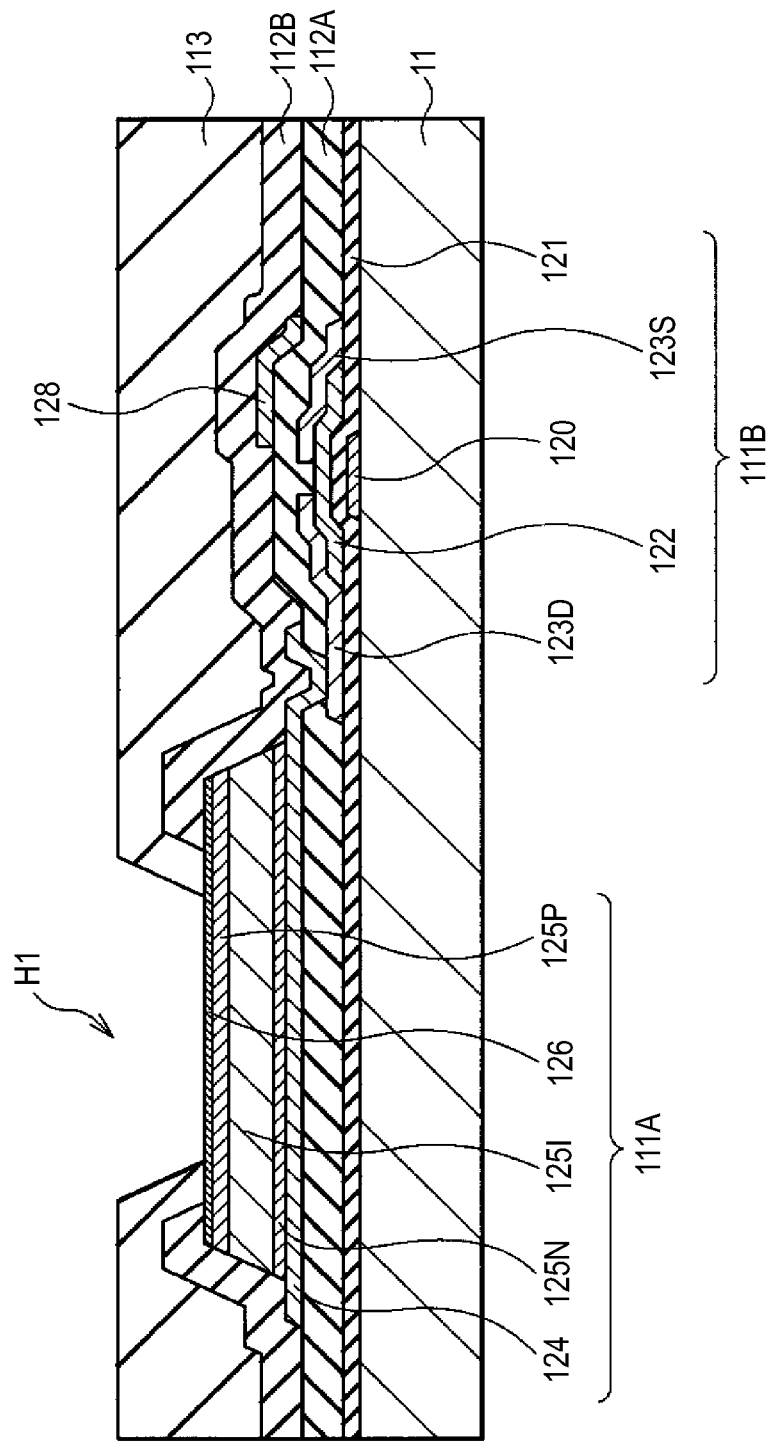
FIG. 10 is a cross-sectional view showing a process continued from FIG. 9.

Next, as shown in FIG. 10, the second interlayer insulating film 112B made of the above-described material is formed so as to cover the relay electrode 128 and the thin-film transistor 111B as well as the side surface and the end portion of the upper surface (on the upper electrode 127) by using, for example, the CVD method and the photolithography method. After that, the first planarization film 113A made of the above-described material is deposited on the entire surface of the second interlayer insulating film. 112B (the upper layer side of the photodiode 111A and the thin-film transistor 111B) by using, for example, the CVD method. Then, the opening H1 is formed so as to correspond to the forming region of the photodiode 111A in the first planarization film 113A by performing, for example, etching (dry etching and the like) using the photolithography.

Figure 11:
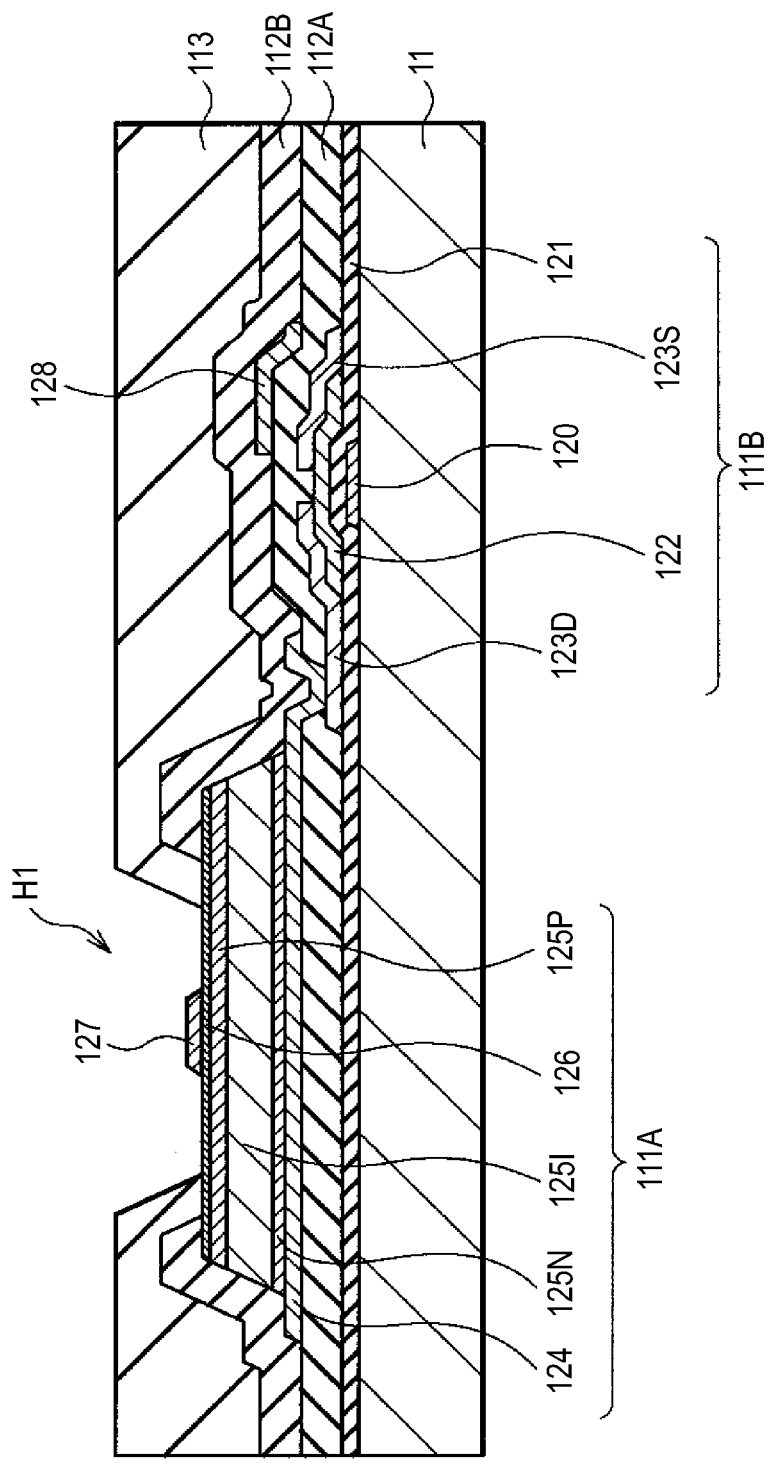
FIG. 11 is a cross-sectional view showing a process continued from FIG. 10.

Subsequently, as shown in FIG. 11, the wiring layer 127 made of, for example, Al, Cu and so on is formed in the opening H1 in the first planarization film 113A (on the upper electrode 126) by using, for example, the sputtering method and the photolithography method.

Figure 12:
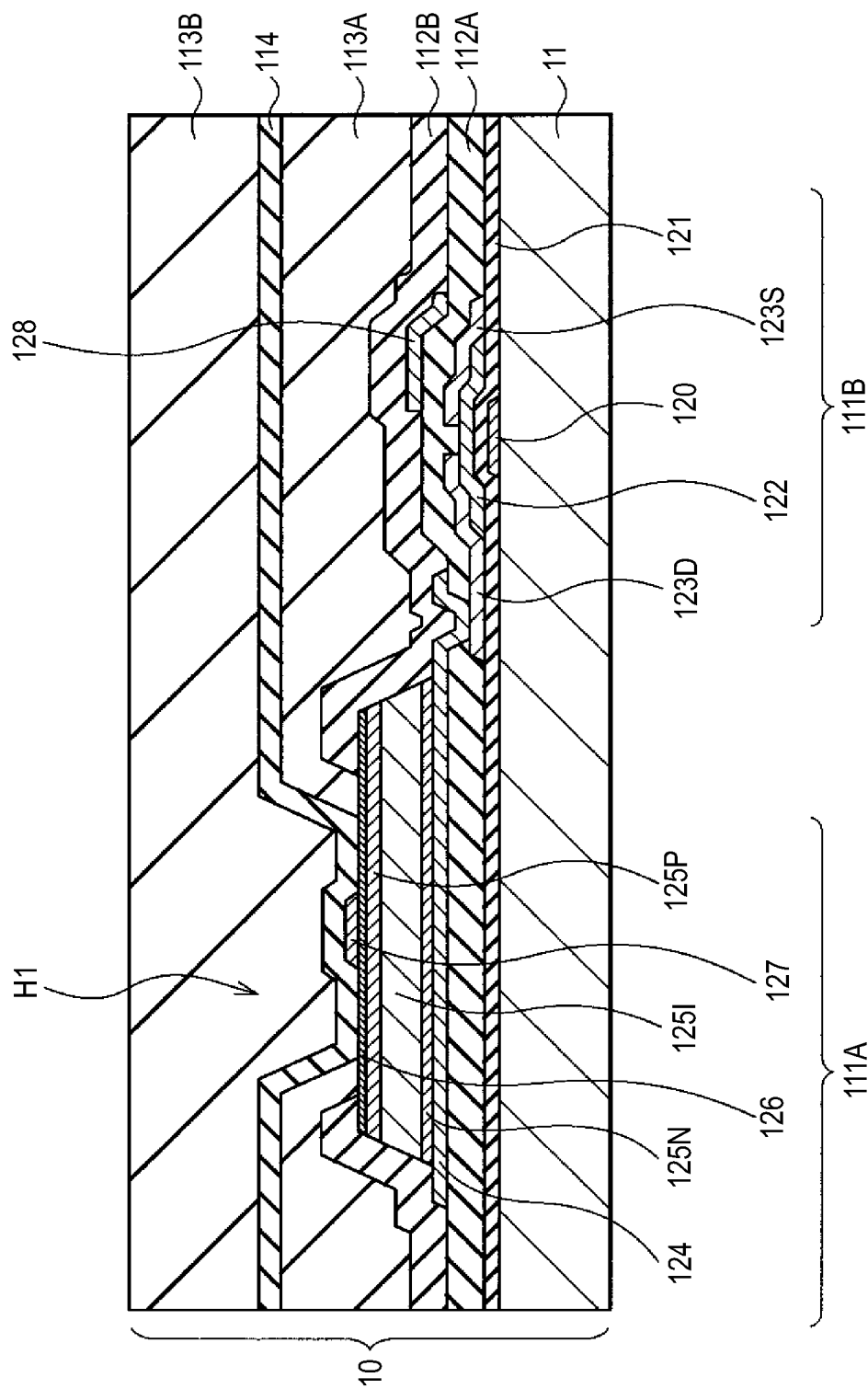
FIG. 12 is a cross-sectional view showing a process continued from FIG. 11.

After that, as shown in FIG. 12, the protection film 114 and the second planarization film 113B made of the above-described materials are deposited in this order on the entire surface of the first planarization film 113A, the upper electrode 126 and the wiring layer 127 by using, for example, the CVD method. Consequently, the sensor substrate 10 shown in FIG. 1 is completed.

Lastly, the wavelength conversion member 20 separately fabricated by the manufacturing method described above is bonded on the sensor substrate 10 (for example, a peripheral area of the pixel unit 12 is bonded by a sealant and the like or the periphery of the pixel unit 12 or the entire surface of the panel is pressed to be fixed). Accordingly, the radiation imaging apparatus 1 shown in FIG. 1 is completed.

[Influence and Effect of Imaging Apparatus 1]

(1. Imaging Operations)

In the radiation imaging apparatus 1, when a radiation ray irradiated from, for example, a not-shown radiation source (for example, an X-ray source) and transmitted through an object (detection material) is incident, the incident radiation ray is photoelectrically converted after wavelength conversion, and an image of the object is obtained as electric signals (imaging signals). In detail, the radiation ray incident on the radiation imaging apparatus 1 is first converted into a wavelength in the sensitivity range (the visible range in this case) of the photodiode 111A in the wavelength conversion member 20 (visible light is emitted in the wavelength conversion member 20). The visible light emitted from the wavelength conversion member 20 is incident on the sensor substrate 10.

In the sensor substrate 10, when a given reference potential (bias potential) is applied to one end of the photodiode 111A (for example, the upper electrode 126) through the wiring layer 127, light incident from the direction of the upper electrode 126 is converted into a signal charge of a charge amount corresponding to the light receiving amount (photoelectric conversion is performed). The signal charge generated by the photoelectric conversion is taken out from the other end (for example, the lower electrode 124) of the photodiode 111A as photocurrent.

In detail, the electric charges generated by photoelectric conversion in the photodiode 111A are read out as photocurrent and outputted from the thin-film transistors 111B as an imaging signal. The imaging signal outputted in this manner is outputted (read out) to the vertical signal line 18 in accordance with a row scanning signal transmitted from the row scanning unit 13 through the pixel drive line 17. The imaging signals outputted to the vertical signal lines 18 are outputted to the horizontal selection unit 14 in units of pixel columns through the vertical signal lines 18. Then, imaging signals of respective pixels transmitted through respective vertical signal line 18 are sequentially outputted to the horizontal signal line 19 by the selective scanning by the column scanning unit 15 to be transmitted to the outside of the substrate 11 through the horizontal signal line 19 (output data Dout is outputted to the outside). In the above manner, the imaged image using the radiation ray is obtained in the radiation imaging apparatus 1.

(2. Influence of the Relay Electrode 128)

Here, the influence of the relay electrode 128 in the radiation imaging apparatus 1 according to the embodiment will be explained in detail while comparing with a comparative example with reference to FIG. 1, FIGS. 3 to 6, and FIGS. 13 to 15.

(Comparative Example)

Figure 13:
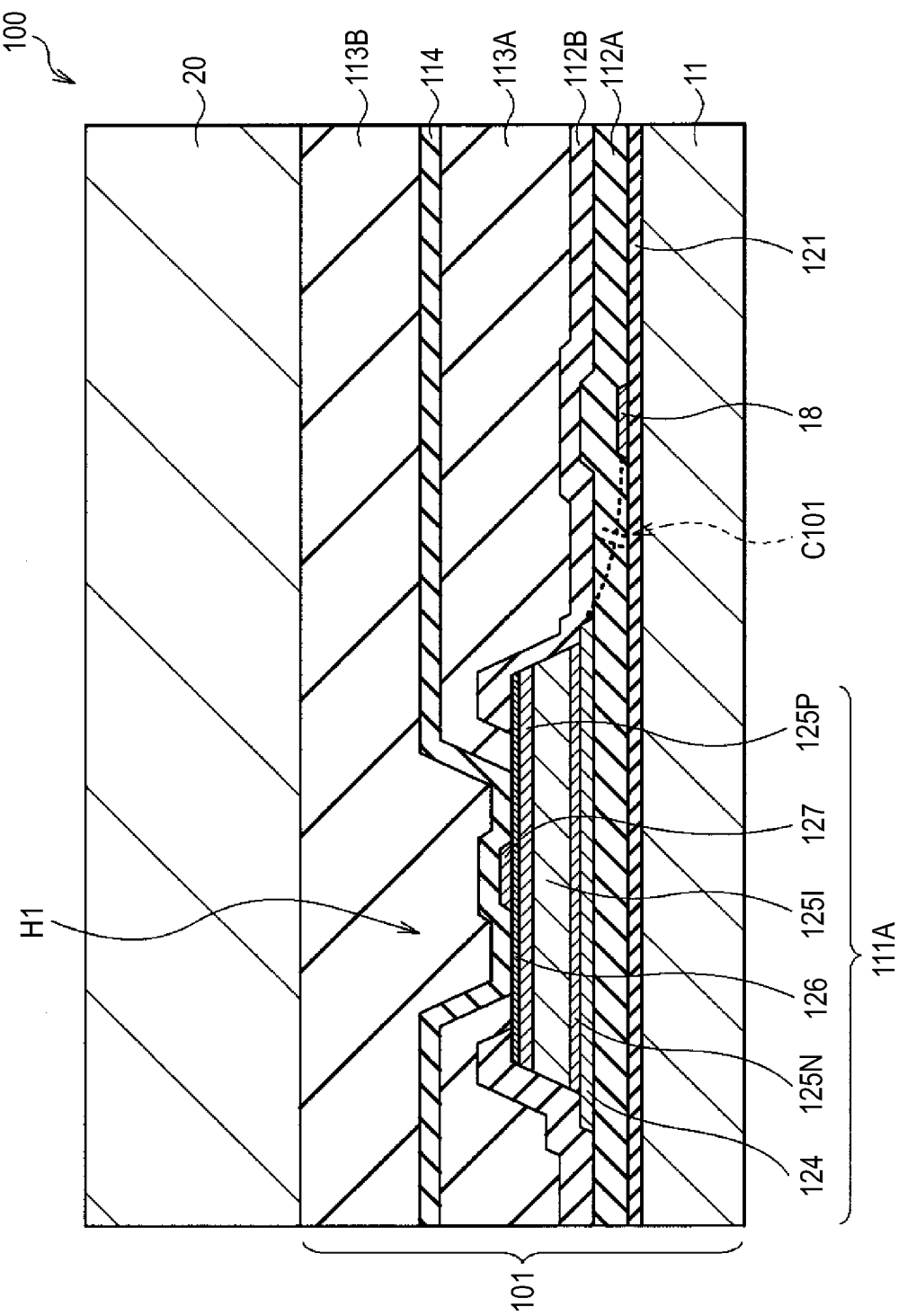
FIG. 13 is a cross-sectional view showing a structure and influence of a radiation imaging apparatus according to a comparative example.

FIG. 13 shows a cross-sectional structure of a radiation imaging apparatus (radiation imaging apparatus 100) according to the comparative example. The radiation imaging apparatus 100 is provided with a sensor substrate 101 not having the relay electrode 128 instead of the sensor substrate 10 having the above-described relay electrode 128 in the radiation imaging apparatus 1 according to the embodiment shown in FIG. 4.

Figure 14:
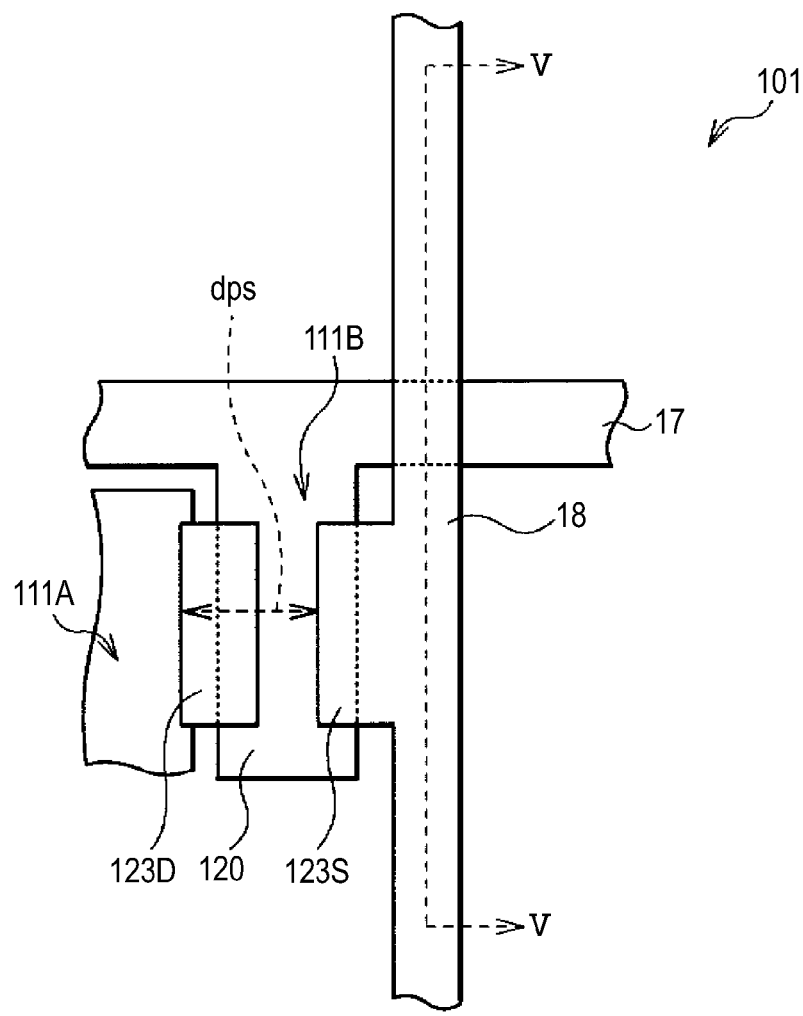
FIG. 14 is a schematic view showing part of a planar structure of the sensor substrate shown in FIG. 13 in an enlarged state.
Figure 15:
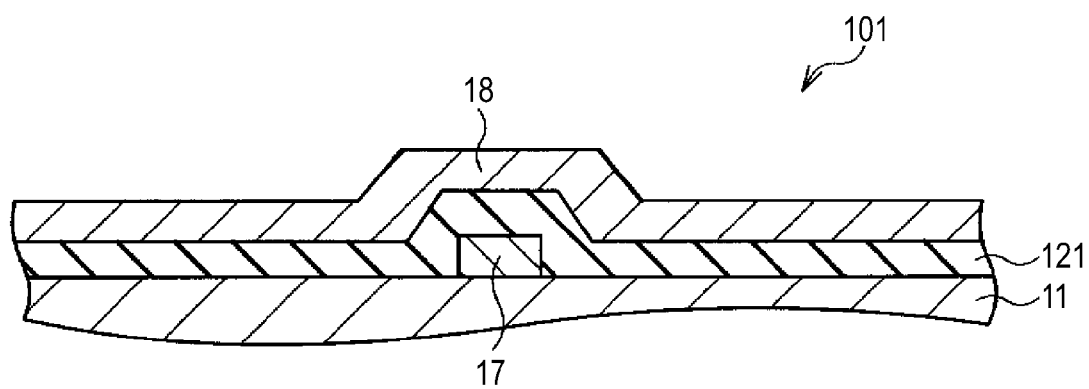
FIG. 15 is a schematic view showing part of a cross-sectional structure taken along the line V-V shown in FIG. 14.

FIG. 14 schematically shows part of a planar structure of the sensor substrate 101 of the comparative example in an enlarged state and FIG. 15 schematically shows part of a cross-sectional structure taken along the V-V line in FIG. 14. As shown in FIG. 13 to FIG. 15, the vertical signal line 18 is formed in the same layer as the source electrode 123S in the thin-film transistor 111B and is directly connected to the source electrode 123S in the sensor substrate 101. That is, the vertical signal line 18 functions as a source line.

As the relay electrode 128 is not provided in the sensor substrate 101 in the radiation imaging apparatus 100 (the source electrode 123S of the thin-film transistor 111B is directly connected to the vertical signal line 18) as described above, deterioration in image quality of the imaged image occurs due to the following reasons.

That is, first, a distance dps between the photodiode 111A and the vertical signal line 18 is relatively short (the vertical signal line 18 is arranged at a position relatively close to the photodiode 111A), for example, as shown in FIG. 14. Accordingly, for example, as schematically shown in FIG. 13, a large coupling capacity C101 is formed between the photodiode 111A (specifically, the lower electrode 124) and the vertical signal line 18. Then, noise components in the imaging signal transmitted on the vertical signal line 18 (the signal readout from the photodiode 111A through the thin-film transistor 111B) are increased due to the large coupling capacity C101. As a result, S/N ratio in the imaging signal is reduced, which leads to deterioration of image quality of the imaged image.

(Present Embodiment)

In response to the above, the relay electrode 128 electrically connecting between the thin-film transistor 111B (source electrode 123S) and the vertical signal line 18 to relay between them is provided in the sensor substrate 10 in the radiation imaging apparatus 1 according to the present embodiment.

Accordingly, the distance dps between the photodiode 111A and the vertical signal line 18 shown in FIG. 5 becomes relatively long as compared with the comparative example (refer to FIG. 14) (the vertical signal line 18 is arranged at a position relatively apart from the photodiode 111A). Therefore, the coupling capacity formed between the photodiode 111A (lower electrode 124) and the vertical signal line 18 is reduced as compared with the comparative example in which the relay electrode 128 is not provided, which reduces noise components in the imaging signal transmitted on the vertical signal line 18. As the result of reducing noise components in the imaging signal as described above, S/N ratio is improved as compared with the comparative example and image quality of the imaged image is improved.

In this case, the relay electrode 128 is formed in the same layer as the lower electrode 124 of the photodiode 111A (the relay electrode 128 is formed in the same process and made of the same material as the lower electrode 124) in this case. Accordingly, the relay electrode 128 can be formed without increasing the number of processes at the manufacture, which avoids the increase of manufacturing costs. Furthermore, the vertical signal line 18 is formed in the same layer as the gate electrode 120 and the pixel drive line 17 (gate line) (the vertical signal line 18 is formed in the same process and made of the same material). That is, the vertical signal line 18 is formed in the different layer from the comparative example in which the vertical signal line 18 is formed in the same layer as the source electrode 123S and the drain electrode 123D.

As described above, the relay electrode 128 electrically connecting and relaying between the driving device (thin-film transistor 111B) of the photodiode 111A and the vertical signal line 18 for reading the imaging signal obtained in the photodiode 111A through the thin-film transistor 111B is provided in the sensor substrate 10, which reduces noise components in the imaging signal. Therefore, image quality of the imaged image can be improved.

2. Modification Example

Subsequently, a modification example of the embodiment will be explained. The same symbols are given to the same components as the embodiment and explanation thereof will be appropriately omitted.

Figure 16:
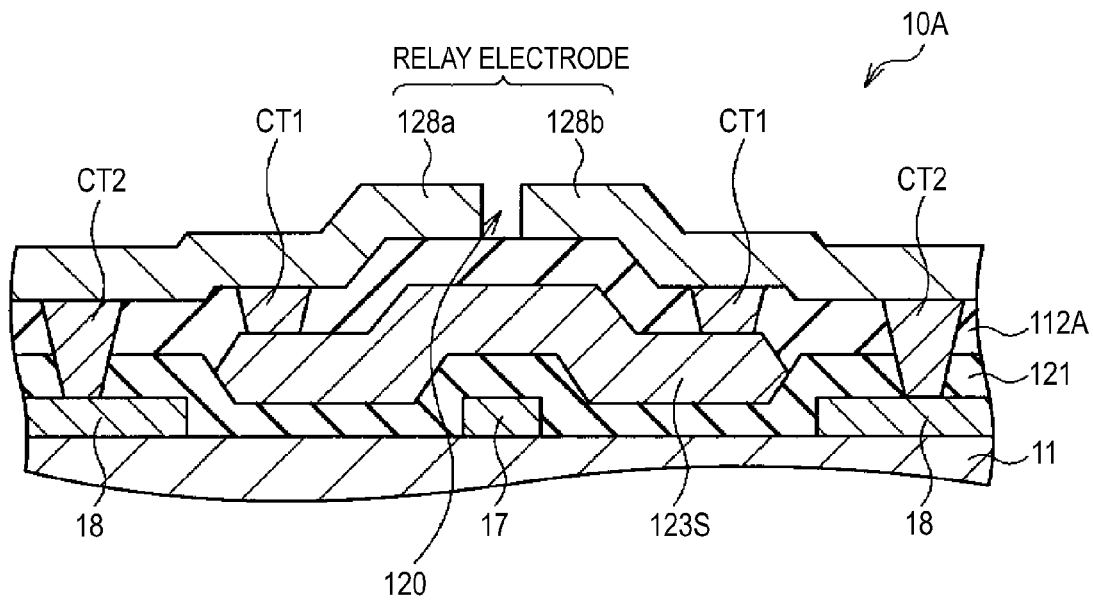
FIG. 16 is a schematic view showing a cross-sectional structure example of a sensor substrate in a radiation imaging apparatus according to a modification example.

FIG. 16 schematically shows an example of a cross-sectional structure of a sensor substrate (sensor substrate 10A) to be used for a radiation imaging apparatus according to a modification example. In the radiation imaging apparatus according to the modification example, the sensor substrate 10A to be explained below is provided instead of the sensor substrate 10 in the radiation imaging apparatus 1 according to the embodiment.

The sensor substrate 10A has basically the same structure as the sensor substrate 10, however, the structure (shape) of relay electrodes 128a and 128b explained below differs from the structure of the relay electrode 128 in the sensor substrate 10.

That is, a pair of relay electrodes 128a and 128b are formed through a separation portion 120 (gap portion) in the sensor substrate 10A, which differs in this point from the sensor substrate 10 in which the single relay electrode 128 is continuously (integrally) formed. Specifically, the vertical signal line 18 on one side is electrically connected to the source electrode 123S through the contact portion CT2, the relay electrode 128a and the contact portion CT1. Namely, the relay electrode 128a electrically connects between the vertical signal line 18 on one side and the source electrode 123S to relay between them. On the other hand, the vertical signal line 18 on the other side is electrically connected to the source electrode 5123 through the contact portion CT2, the relay electrode 128b and the contact portion CT1. Namely, the relay electrode 128b electrically connects between the vertical signal line 18 on the other side and the source electrode 123S to relay between them.

Also in the modification having the above structure, the same effect can be obtained by the same influence as the above embodiment. In the modification example, as the relay electrode is cut (separated) into two relay electrodes 128a and 128b, it is necessary to individually provide the contact portions CT1 in both sides of the relay electrodes 128a and 128b. On the other hand, the single relay electrode 128 is applied in the above embodiment, therefore, the contact portion CT1 may be provided only in the vertical signal line 18 on one side.

3. Application Example

Subsequently, an example of applying the imaging apparatus (radiation imaging apparatus) according to the embodiment and the modification example to an imaging display system (radiation imaging display system) will be explained.

Figure 17:
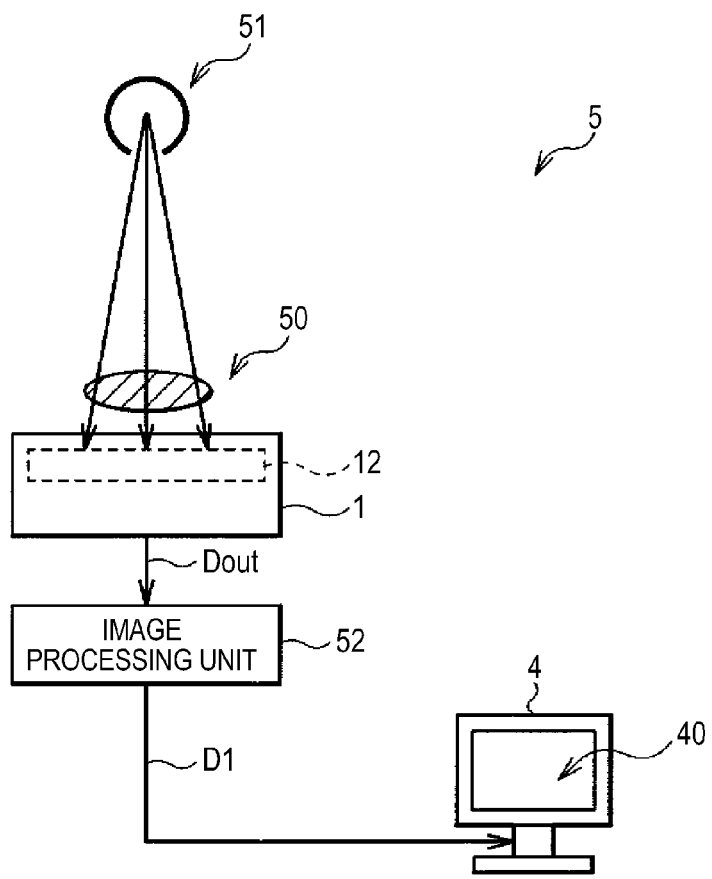
FIG. 17 is a schematic view showing an outline configuration of a radiation imaging display system according to an application example.

FIG. 17 schematically shows an outline configuration example of an imaging display system (radiation imaging display system 5) according to an application example. The radiation imaging display system 5 is an imaging display system using radiation rays, including the radiation imaging apparatus 1 having the pixel unit 12 and the like according to the embodiment and so on (the radiation imaging apparatus including the sensor substrate 10 or the sensor substrate 10A), an image processing unit 52 and a display device 4.

The image processing unit 52 performs given image processing to the output data Dout (imaging signals) outputted from the radiation imaging apparatus 1 to thereby generate image data D1. The display device 4 performs image display based on the image data D1 generated by the image processing unit 52 on a given monitor screen 40.

In the radiation imaging display system 5 having the above configuration, the radiation imaging apparatus 1 acquires the output data Dout of an object 50 based on irradiation light (a radiation ray in this case) irradiated from a light source (a radiation source 51 such as the X-ray source in this case) toward the object 50, outputting the data to the image processing unit 52. The image processing unit 52 performs the given image processing to the inputted output data Dout and outputs the image data (display data) D1 obtained after the image processing to the display device 4. The display device 4 displays image information (an imaged image) on the monitor screen 40 based on the inputted image data D1.

As described above, in the radiation imaging system 5 according to the application example, the image of the object 50 can be acquired as electric signals in the radiation imaging apparatus 1, therefore, the image can be displayed by transmitting the acquired electric signals to the display device 4. That is, the image of the object 50 can be observed without using a radiograph film as in the past, and further, moving picture imaging and moving picture display can be realized.

4. Other Modification Examples

The technology of the present disclosure has been explained by citing the embodiment, the modification example and the application example, however, the present disclosure is not limited to the above embodiment and so on, and various modifications can occur.

For example, the explanation has been made in the above embodiment and so on by citing the case where the semiconductor layer in the photodiode 111A and the thin-film transistor 111B is chiefly made of an amorphous semiconductor (amorphous silicon and the like) as an example, however, the present disclosure is not limited to the example. That is, the semiconductor layer may be made of, for example, a polycrystalline semiconductor (polycrystalline silicon and the like) or a microcrystalline semiconductor (microcrystalline silicon and the like).

The explanation has been also made in the above embodiment and so on by citing the case where the relay electrodes 128, 128a and 128b are formed in the same layer as the lower electrode 124 of the photodiode 111A as an example, however, the present disclosure is not limited to the example. That is, the relay electrodes 128, 128a and 128b may be formed in a different layer from the lower electrode 124 as long as the relay electrodes 128, 128a and 128b electrically connect between the driving device (thin-film transistor 111B) and the vertical signal line 18 to relay between them.

Figure 18:
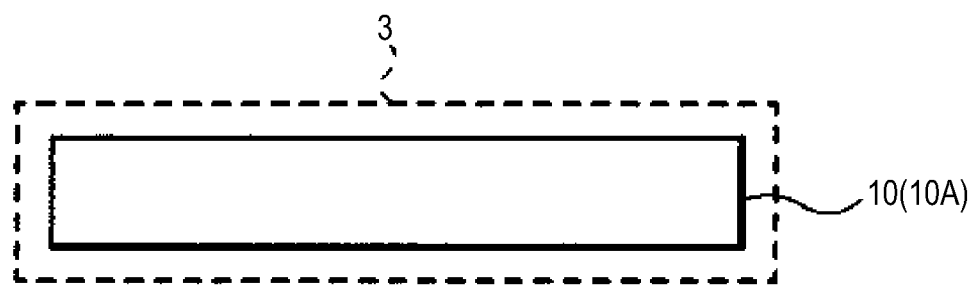
FIG. 18 is a schematic view showing an outline configuration of an imaging apparatus according to another modification example.

Furthermore, the explanation has been made in the above embodiment and so on by citing the case where the imaging apparatus is configured as the radiation imaging apparatus as an example, however, the present disclosure can be applied to imaging apparatuses other than the radiation imaging apparatus (and imaging display systems other than the radiation imaging display system). Specifically, it is possible to apply a structure in which the sensor substrate 10/10A explained in the above embodiment and so on is included while the wavelength conversion member 20 is omitted (not provided) as in an imaging apparatus 3 shown in FIG. 18. Also in the case of applying the structure, the same effect can be obtained as the relay electrodes 128, 128a and 128b explained in the above embodiment and so on are provided in the sensor substrate 10/10A.

The present disclosure can apply the following configurations.

(1) An imaging apparatus including
a sensor substrate,
in which the sensor substrate has
plural photoelectric conversion devices and driving devices thereof formed on a substrate,
signal lines for reading imaging signals obtained in the photoelectric conversion devices through the driving devices and
relay electrodes electrically connecting between the driving devices and the signal lines to relay between them.

(2) The imaging apparatus described in the above (1),
in which the photoelectric conversion device is configured by a lower electrode, a photoelectric conversion layer and an upper electrode being stacked in this order, and
the relay electrode is formed in the same layer as the lower electrode.

(3) The imaging apparatus described in the above (1) or (2),
in which the driving device is a thin-film transistor having a gate electrode, a source electrode and a drain electrode, and
the source electrode is electrically connected to the relay electrode and the drain electrode is electrically connected to the photoelectric conversion device.

(4) The imaging apparatus described in the above (3),
in which the signal line is formed in the same layer as the gate electrode.

(5) The imaging apparatus described in the above (3) or (4),
in which the relay electrode is formed on an upper layer side of the signal line, the source electrode, the drain electrode and the gate electrode.

(6) The imaging apparatus described in any of the above (1) to (5),
in which the relay electrode is locally formed so as to correspond to the driving device of each photoelectric conversion device.

(7) The imaging apparatus described in any of the above (1) to (6),
in which electrical connection is performed between the relay electrode and the driving device as well as between the relay electrode and the signal line respectively through contact portions.

(8) The imaging apparatus described in any of the above (1) to (7),
in which the photoelectric conversion device is formed by a PIN-type photodiode.

(9) The imaging apparatus described in any of the above (1) to (8), further including
a waveform conversion member arranged on the sensor substrate and performing wavelength conversion of an incident radiation ray into a sensitivity range of the photoelectric conversion device, which is configured as a radiation imaging apparatus.

(10) The imaging apparatus described in the above (9),
in which the radiation ray is an X-ray.

(11) An imaging display system including
an imaging apparatus having a sensor substrate, and
a display device performing image display based on imaging signals obtained by the imaging apparatus,
in which the sensor substrate has
plural photoelectric conversion devices and driving devices thereof formed on a substrate,
signal lines for reading imaging signals obtained in the photoelectric conversion devices through the driving devices and
relay electrodes electrically connecting between the driving devices and the signal lines to relay between them.

(12) A manufacturing method of an imaging apparatus including
forming a sensor substrate,
in which a process of forming the sensor substrate has
forming plural photoelectric conversion devices and driving devices thereof on a substrate,
forming signal lines for reading imaging signals obtained in the photoelectric conversion devices through the driving devices, and
forming relay electrodes electrically connecting between the driving devices and the signal lines to relay between them.

The present disclosure contains subject matter related to that disclosed in Japanese Priority Patent Application JP 2012-026251 filed in the Japan Patent Office on Feb. 9, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging apparatus including a sensor substrate, the sensor substrate comprising:
   photoelectric conversion devices on a substrate;
   driving devices on the substrate, which respectively correspond to the photoelectric conversion devices;
   signal lines for reading imaging signals obtained in the photoelectric conversion devices through the corresponding driving devices, respective ones of the signal lines having two separate parts including a first signal line part and a second signal line part; and
   relay electrodes that electrically connect and relay between the driving devices and the corresponding signal lines, respective ones of the relay electrodes being disposed over the corresponding first signal line part and the corresponding second signal line part, wherein
   the photoelectric conversion devices are PIN-type photodiodes respectively including a lower electrode, a photoelectric conversion layer, and an upper electrode stacked in this order,
   the driving devices are thin-film transistors respectively including a gate electrode, a source electrode disposed between the corresponding first signal line part and the corresponding second signal line part, and a drain electrode electrically connected to the corresponding lower electrode, and
   the relay electrodes are respectively electrically connected, through a plurality of contact holes, to each of the corresponding source electrode, the corresponding first signal line part, and the corresponding second signal line part.

2. The imaging apparatus according to claim 1,
wherein
the relay electrode is formed in the same layer as the corresponding lower electrode.

3. The imaging apparatus according to claim 1,
wherein the signal line is formed in the same layer as the corresponding gate electrode.

4. The imaging apparatus according to claim 1,
wherein the relay electrode is formed on an upper layer side of the corresponding signal line, the corresponding source electrode, the corresponding drain electrode and the corresponding gate electrode.

5. The imaging apparatus according to claim 1,
wherein the relay electrode is formed in the vicinity of the corresponding driving device of each photoelectric conversion device.

6. The imaging apparatus according to claim 1, further comprising:
   a waveform conversion member arranged on the sensor substrate and performing wavelength conversion of an incident radiation ray into a sensitivity range of the photoelectric conversion device, which is configured as a radiation imaging apparatus.

7. The imaging apparatus according to claim 6,
in which the radiation ray is an X-ray.

8. An imaging display system comprising:
   an imaging apparatus having a sensor substrate; and
   a display device performing image display based on imaging signals obtained by the imaging apparatus,
   the sensor substrate comprising:
   photoelectric conversion devices on a substrate;
   driving devices on the substrate, which respectively correspond to the photoelectric conversion devices;

signal lines for reading imaging signals obtained in the photoelectric conversion devices through the corresponding driving devices, respective ones of the signal lines having two separate parts including a first signal line part and a second signal line part; and relay electrodes that electrically connect and relay between the driving devices and the corresponding signal lines, respective ones of the relay electrodes being disposed over the corresponding first signal line part and the corresponding second signal line part, wherein the photoelectric conversion devices are PIN-type photodiodes respectively including a lower electrode, a photoelectric conversion layer, and an upper electrode stacked in this order, the driving devices are thin-film transistors respectively including a gate electrode, a source electrode disposed between the corresponding first signal line part and the corresponding second signal line part, and a drain electrode electrically connected to the corresponding lower electrode, and the relay electrodes are respectively electrically connected, through a plurality of contact holes, to each of the corresponding source electrode, the corresponding first signal line part, and the corresponding second signal line part.

9. A manufacturing method of an imaging apparatus including forming a sensor substrate, the process of forming the sensor substrate comprising:

forming photoelectric conversion devices on a substrate;

forming driving devices on the substrate, which respectively correspond to the photoelectric conversion devices;

forming signal lines for reading imaging signals obtained in the photoelectric conversion devices through the corresponding driving devices, respective ones of the signal lines having two separate parts including a first signal line part and a second signal line part; and forming relay electrodes that electrically connect and relay between the driving devices and the corresponding signal lines, respective ones of the relay electrodes being disposed over the corresponding first signal line part and the corresponding second signal line part, wherein the photoelectric conversion devices are PIN-type photodiodes respectively including a lower electrode, a photoelectric conversion layer, and an upper electrode stacked in this order, the driving devices are thin-film transistors respectively including a gate electrode, a source electrode disposed between the corresponding first signal line part and the corresponding second signal line part, and a drain electrode electrically connected to the corresponding lower electrode, and the relay electrodes are respectively electrically connected, through a plurality of contact holes, to each of the corresponding source electrode, the corresponding first signal line part, and the corresponding second signal line part.

* * * * *